(12) United States Patent
Ichikawa et al.

(10) Patent No.: US 11,158,785 B2
(45) Date of Patent: Oct. 26, 2021

(54) MAGNETORESISTANCE EFFECT ELEMENT INCLUDING A CRYSTALLIZED HEUSLER ALLOY

(71) Applicant: TDK CORPORATION, Tokyo (JP)

(72) Inventors: Shinto Ichikawa, Tokyo (JP); Kazuumi Inubushi, Tokyo (JP); Katsuyuki Nakada, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/131,069

(22) Filed: Dec. 22, 2020

(65) Prior Publication Data
US 2021/0193913 A1 Jun. 24, 2021

(30) Foreign Application Priority Data

Dec. 24, 2019 (JP) .............................. JP2019-232751
Dec. 15, 2020 (JP) .............................. JP2020-207759

(51) Int. Cl.
| | |
|---|---|
| *G11B 5/39* | (2006.01) |
| *H01L 43/08* | (2006.01) |
| *H01L 43/04* | (2006.01) |
| *G01R 33/09* | (2006.01) |
| *G11C 11/16* | (2006.01) |
| *H01L 43/10* | (2006.01) |

(52) U.S. Cl.
CPC ............ *H01L 43/08* (2013.01); *G01R 33/091* (2013.01); *G01R 33/093* (2013.01); *G11B 5/3903* (2013.01); *G11B 5/3906* (2013.01); *G11B 5/3909* (2013.01); *G11C 11/161* (2013.01); *H01L 43/04* (2013.01); *H01L 43/10* (2013.01)

(58) Field of Classification Search
None
See application file for complete search history.

(56) References Cited

U.S. PATENT DOCUMENTS

| | | | |
|---|---|---|---|
| 9,412,399 B2 | 8/2016 | Childress et al. | |
| 10,867,625 B1* | 12/2020 | Freitag | G11B 5/1278 |
| 2013/0236639 A1* | 9/2013 | Carey | G11B 5/3906 |
| | | | 427/130 |
| 2015/0010780 A1* | 1/2015 | Carey | G11B 5/3929 |
| | | | 428/811.3 |

(Continued)

FOREIGN PATENT DOCUMENTS

JP        6137577 B2        5/2017

OTHER PUBLICATIONS

Goripati et al., "Bi-quadratic interlayer exchange coupling in Co2MnSi/Ag/Co2MnSi pseudo spin-valve," Journal of Applied Physics, 2011, vol. 110, 123914-1-123914-7.

(Continued)

*Primary Examiner* — Jefferson A Evans
(74) *Attorney, Agent, or Firm* — Oliff PLC

(57) ABSTRACT

A magnetoresistance effect element includes: a first ferromagnetic layer; a second ferromagnetic layer; and a non-magnetic layer provided between the first ferromagnetic layer and the second ferromagnetic layer, wherein at least one of the first ferromagnetic layer and the second ferromagnetic layer includes a first layer and a second layer in order from the side closer to the non-magnetic layer, the first layer contains a crystallized Co-based Heusler alloy, at least a part of the second layer is crystallized, the second layer contains a ferromagnetic element, boron element and an additive element, and the additive element is any element selected from a group consisting of Ti, V, Cr, Cu, Zn, Zr, Mo, Ru, Pd, Ta, W, Ir, Pt, and Au.

14 Claims, 9 Drawing Sheets

(56) References Cited

U.S. PATENT DOCUMENTS

| | | | |
|---|---|---|---|
| 2016/0019917 A1 | 1/2016 | Du et al. | |
| 2016/0043301 A1* | 2/2016 | Butler | H01L 43/08 |
| | | | 257/427 |
| 2017/0117458 A1* | 4/2017 | Sonobe | H01L 43/10 |
| 2018/0309047 A1* | 10/2018 | Sasioglu | H01L 29/66984 |
| 2018/0366172 A1* | 12/2018 | Wang | H01L 27/222 |
| 2019/0006074 A1* | 1/2019 | Inubushi | H01F 10/329 |
| 2019/0181334 A1* | 6/2019 | Inubushi | H01F 10/325 |
| 2019/0279667 A1* | 9/2019 | Freitag | G11B 5/3909 |
| 2019/0386205 A1* | 12/2019 | Gosavi | H01L 43/04 |
| 2020/0321393 A1* | 10/2020 | Manipatruni | H01L 43/12 |
| 2021/0175416 A1* | 6/2021 | Jeong | H01F 41/32 |

OTHER PUBLICATIONS

Furubayashi et al., "Structure and transport properties of current-perpendicular-to-plane spin valves using Co2FeAl0.5Si0.5 and Co2MnSi Heusler alloy electrodes," Journal of Applied Physics, 2010, vol. 107, 113917-1-113917-7.

Iwase et al., "Large Interface Spin-Asymmetry and Magnetoresistance in Fully Epitaxial Co2MnSi/Ag/Co2MnSi Current-Perpendicular-to-Plane Magnetoresistive Devices," Applied Physics Express, 2009, vol. 2, 063003-1-063003-3.

Jung et al., "Enhancement of magnetoresistance by inserting thin NiAl layers at the interfaces in Co2FeGa0.5Ge0.5/Ag/Co2FeGa0.5Ge0.5 current-perpendicular-to-plane pseudo spin valves," 2016, vol. 108, 102408-1-102408-5.

Choi et al., "Enhancement of current-perpendicular-to-plane giant magnetoresistance by insertion of amorphous ferromagnetic underlayer in Heusler alloy-based spin-valve structures," Applied Physics Express, 2017, vol. 10, 013006-1-013006-4.

* cited by examiner

MAGNETORESISTANCE EFFECT ELEMENT INCLUDING A CRYSTALLIZED HEUSLER ALLOY

BACKGROUND OF THE INVENTION

Field of the Invention

The present invention relates to a magnetoresistance effect element.

Description of Related Art

A magnetoresistance effect element is an element of which a resistance value in a lamination direction changes due to a magnetoresistance effect. The magnetoresistance effect element includes two ferromagnetic layers and a non-magnetic layer sandwiched therebetween. A magnetoresistance effect element in which a conductor is used for the non-magnetic layer is called as a giant magnetoresistance effect (GMR) element and a magnetoresistance effect element in which an insulating layer (a tunnel barrier layer or a barrier layer) is used for the non-magnetic layer is called a tunneling magnetoresistance effect (TMR) element. Magnetoresistance effect elements can be applied to various applications such as a magnetic sensor, a radio frequency component, a magnetic head, and a non-volatile random access memory (MRAM).

Patent Document 1 describes a magnetic sensor including a magnetoresistance effect element using a Heusler alloy for a ferromagnetic layer. The Heusler alloy has high spin polarization and is expected to be able to increase the output signal of the magnetic sensor. On the other hand, Patent Document 1 describes that the Heusler alloy is difficult to crystallize unless a film is formed on a thick base substrate having a high temperature or a predetermined crystallinity. Patent Document 1 describes that the film formation at a high temperature and the thick base substrate can cause a decrease in the output of the magnetic sensor. Patent Document 1 describes that the output of the magnetic sensor is increased by forming the ferromagnetic layer into a laminated structure of a non-crystalline layer and a crystalline layer.

PATENT DOCUMENTS

[Patent Document 1] U.S. Pat. No. 9,412,399

SUMMARY OF THE INVENTION

The magnitude of the output signal of a magnetic sensor depends on the magnetic resistance change ratio (MR ratio) of the magnetoresistance effect element. In general, the MR ratio tends to increase as the crystallinity of the ferromagnetic layer sandwiching the non-magnetic layer increases. In the magnetoresistance effect element described in Patent Document 1, the ferromagnetic layer in contact with the non-magnetic layer is amorphous and a sufficiently large MR ratio cannot be easily obtained.

The present invention has been made in view of the above-described circumstances and an object of the present invention is to provide a magnetoresistance effect element capable of realizing a large MR ratio.

In order to solve the above-described problems, the present invention provides the following means.

(1) A magnetoresistance effect element according to a first aspect includes: a first ferromagnetic layer; a second ferromagnetic layer; and a non-magnetic layer provided between the first ferromagnetic layer and the second ferromagnetic layer, wherein at least one of the first ferromagnetic layer and the second ferromagnetic layer includes a first layer and a second layer in order from a side closer to the non-magnetic layer, wherein the first layer contains a crystallized Co-based Heusler alloy (Co Heusler alloy), wherein at least a part of the second layer is crystallized and the second layer contains a ferromagnetic element, elemental boron, and an additive element, and wherein the additive element is any element selected from a group consisting of Ti, V, Cr, Cu, Zn, Zr, Mo, Ru, Pd, Ta, W, Ir, Pt, and Au.

(2) In the magnetoresistance effect element according to the above-described aspect, both the first ferromagnetic layer and the second ferromagnetic layer may include the first layer and the second layer.

(3) In the magnetoresistance effect element according to the above-described aspect, the Co-based Heusler alloy may be represented by CoYZ or $Co_2YZ$ in stoichiometric composition and the Co-based Heusler alloy may have a Co compositional proportion smaller than that of the stoichiometric composition.

(4) In the magnetoresistance effect element according to the above-described aspect, the second layer may be made of crystallized CoFeB-A and the content of Fe may be larger than the content of Co in the second layer.

(5) In the magnetoresistance effect element according to the above-described aspect, the content of the additive element may be larger than the content of boron in the second layer.

(6) In the magnetoresistance effect element according to the above-described aspect, the first layer and the second layer may be lattice-matched.

(7) The magnetoresistance effect element according to the above-described aspect may further include a boron absorbing layer in contact with a surface of the second layer on the side far from the non-magnetic layer and the boron absorbing layer may contain any element selected from a group consisting of Ti, V, Cr, Cu, Zn, Zr, Mo, Ru, Pd, Ta, W, Ir, Pt, and Au.

(8) In the magnetoresistance effect element according to the above-described aspect, the Co-based Heusler alloy may have an $L2_1$ structure or a B2 structure.

(9) In the magnetoresistance effect element according to the above-described aspect, the Co-based Heusler alloy may be represented by $Co_2Y_\alpha Z_\beta$, Y may be one or more elements selected from a group consisting of Fe, Mn, and Cr, and Z may be one or more elements selected from a group consisting of Si, Al, Ga, and Ge, and $\alpha+\beta>2$ may be satisfied.

(10) The magnetoresistance effect element according to the above-described aspect may further include a buffer layer provided at least one between the first ferromagnetic layer and the non-magnetic layer and between the second ferromagnetic layer and the non-magnetic layer, and the buffer layer may include a NiAl alloy or Ni.

(11) In the magnetoresistance effect element according to the above-described aspect, the thickness of the buffer layer may be 0.63 nm or less.

(12) In the magnetoresistance effect element according to the above-described aspect, the non-magnetic layer may be a metal or alloy containing any element selected from a group consisting of Cu, Au, Ag, Al, and Cr.

(13) The magnetoresistance effect element according to the above-described aspect may further include a substrate, the substrate may be a base on which the first ferromagnetic layer, the second ferromagnetic layer, and the non-magnetic layer are laminated, and the substrate may be amorphous.

A magnetoresistance effect element according to the present invention exhibits a large MR ratio.

DETAILED DESCRIPTION OF THE INVENTION

Hereinafter, this embodiment will be described in detail with reference to the drawings as appropriate. The drawings used in the following description may be enlarged for convenience in order to make the features of this embodiment easy to understand and the dimensional ratio of each component may differ from the actual ones. The materials, dimensions, and the like exemplified in the following description are examples and the present invention is not limited thereto and can be appropriately modified without changing the gist thereof.

First Embodiment

Figure 1:
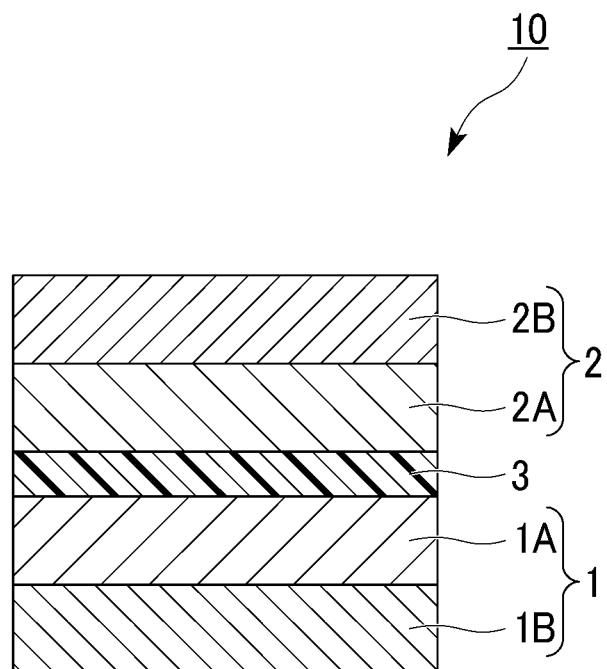
FIG. 1 is a cross-sectional view of a magnetoresistance effect element according to a first embodiment.

FIG. 1 is a cross-sectional view of a magnetoresistance effect element according to a first embodiment. First, directions will be defined. A direction in which the respective layers are laminated on each other is referred to as a lamination direction. Further, a direction intersecting the lamination direction in which each layer extends is referred to as an in-plane direction.

A magnetoresistance effect element 10 shown in FIG. 1 includes a first ferromagnetic layer 1, a second ferromagnetic layer 2, and a non-magnetic layer 3. The non-magnetic layer 3 is located between the first ferromagnetic layer 1 and the second ferromagnetic layer 2.

The magnetoresistance effect element 10 outputs a change in the relative angle between the magnetization of the first ferromagnetic layer 1 and the magnetization of the second ferromagnetic layer 2 as a change in the resistance value. The magnetization of the second ferromagnetic layer 2 is easier to move than, for example, the magnetization of the first ferromagnetic layer 1. When a predetermined external force is applied, the magnetization direction of the first ferromagnetic layer 1 does not change (is fixed) and the magnetization direction of the second ferromagnetic layer 2 changes. Since the magnetization direction of the second ferromagnetic layer 2 changes with respect to the magnetization direction of the first ferromagnetic layer 1, the resistance value of the magnetoresistance effect element 10 changes. In this case, the first ferromagnetic layer 1 may be referred to as a magnetization fixed layer and the second ferromagnetic layer 2 may be referred to as a magnetization free layer. Hereinafter, although the first ferromagnetic layer 1 is described as the magnetization fixed layer and the second ferromagnetic layer 2 is described as the magnetization free layer, this relationship may be reversed.

A difference in ease of movement between the magnetization of the first ferromagnetic layer 1 and the magnetization of the second ferromagnetic layer 2 when a predetermined external force is applied is caused by a difference in coercivity between the first ferromagnetic layer 1 and the second ferromagnetic layer 2. For example, when the thickness of the second ferromagnetic layer 2 is thinner than the thickness of the first ferromagnetic layer 1, the coercivity of the second ferromagnetic layer 2 becomes smaller than the coercivity of the first ferromagnetic layer 1. Further, for example, an antiferromagnetic layer may be provided on the surface opposite to the non-magnetic layer 3 in the first ferromagnetic layer 1 with a spacer layer interposed therebetween. The first ferromagnetic layer 1, the spacer layer, and the antiferromagnetic layer have a synthetic antiferromagnetic structure (SAF structure). The synthetic antiferromagnetic structure includes two magnetic layers sandwiching the spacer layer. The antiferromagnetic coupling between the first ferromagnetic layer 1 and the antiferromagnetic layer increases the coercivity of the first ferromagnetic layer 1 as compared with a case without the antiferromagnetic layer. The antiferromagnetic layer is, for example, IrMn, PtMn, or the like. The spacer layer contains, for example, at least one selected from a group consisting of Ru, Ir, and Rh.

The first ferromagnetic layer 1 and the second ferromagnetic layer 2 contain a ferromagnetic material. All of the first ferromagnetic layer 1 and the second ferromagnetic layer 2 of the magnetoresistance effect element 10 shown in FIG. 1 include first layers 1A and 2A and second layers 1B and 2B. The first ferromagnetic layer 1 includes the first layer 1A and the second layer 1B in order from the side closer to the non-magnetic layer 3. The second ferromagnetic layer 2 includes the first layer 2A and the second layer 2B in order from the side closer to the non-magnetic layer 3.

For example, the first layer 1A and the second layer 1B are lattice-matched and the first layer 2A and the second layer 2B are lattice-matched. This lattice matching means that atoms are continuously arranged in the lamination direction at the interface between the first layer 1A and the second layer 1B and the interface between the first layer 2A and the second layer 2B. The lattice consistency of the first layer 1A and the second layer 1B or the first layer 2A and the second layer 2B is, for example, within 5%. The lattice consistency is the degree of deviation of the lattice constants of the second layers 1B and 2B when the lattice constants of the first layers 1A and 2A are used as a reference. When the first layer 1A and the second layer 1B are lattice-matched and the first layer 2A and the second layer 2B are lattice-matched, the MR ratio of the magnetoresistance effect element 10 increases.

Both the first layers 1A and 2A contain a crystallized Co-based Heusler alloy. Each of the first layers 1A and 2A contains, for example, a Co-based Heusler alloy and at least a part of the Co-based Heusler alloy is crystallized. Each of the first layers 1A and 2A may contain, for example, a completely crystallized Co-based Heusler alloy.

The Heusler alloy is an intermetallic compound with a chemical composition of XYZ or $X_2YZ$. A ferromagnetic Heusler alloy represented by $X_2YZ$ is referred to as a full-Heusler alloy and a ferromagnetic Heusler alloy represented by XYZ is referred to as a half-Heusler alloy. A half-Heusler alloy is one in which a part of atoms at X sites in a full-Heusler alloy lattice are empty. Both are typically intermetallic compounds based on a bcc structure.

Figure 2A:
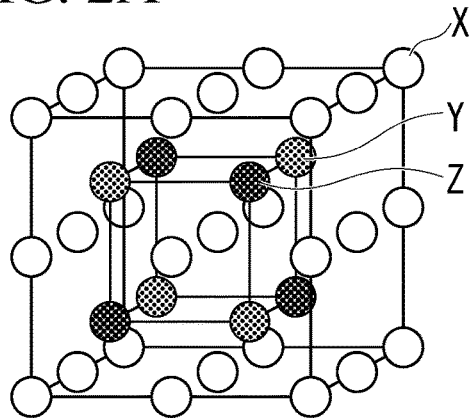
FIGS. 2A to 2F are diagrams showing a crystal structure of a Heusler alloy.
Figure 2D:
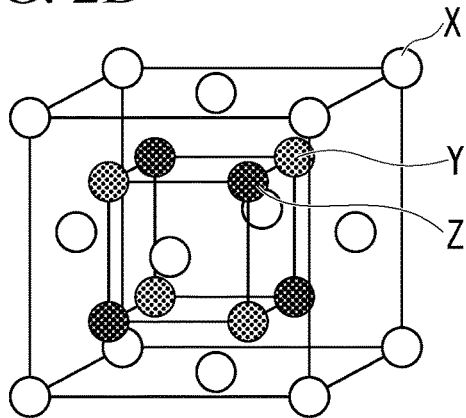
Figure 2B:
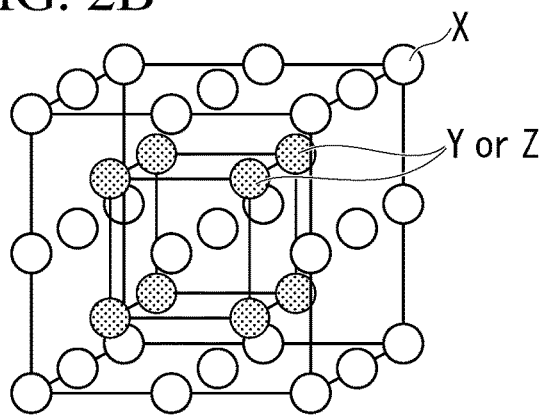
Figure 2E:
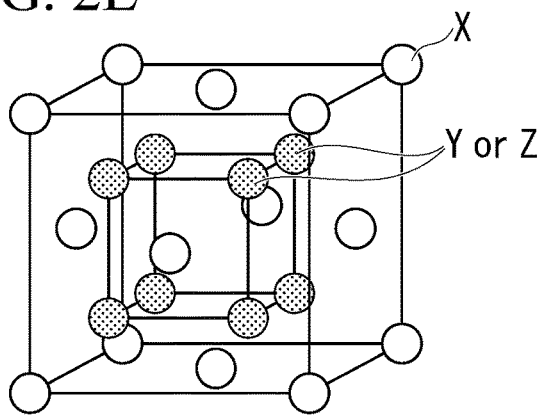
Figure 2C:
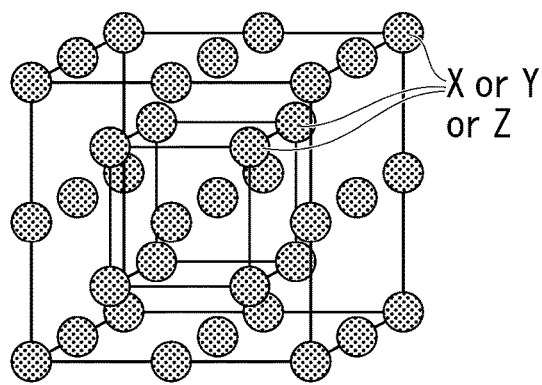
Figure 2F:
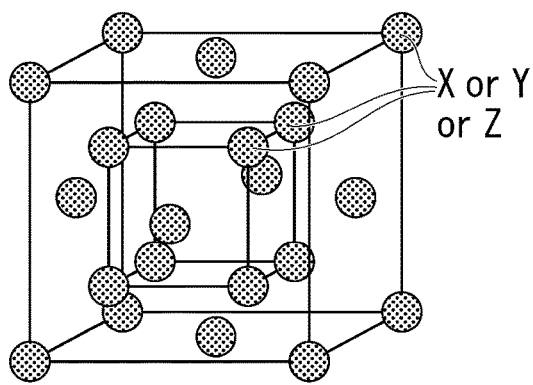

FIGS. 2A to 2F are examples of a crystal structure of the Heusler alloy. FIGS. 2A to 2C are examples of a crystal structure of the full-Heusler alloy and FIGS. 2D to 2F are examples of a crystal structure of the half-Heusler alloy.

FIG. 2A is referred to as an $L2_1$ structure. In the $L2_1$ structure, elements accommodated at X sites, elements accommodated at Y sites, and elements accommodated at Z sites are fixed. FIG. 2B is referred to as a B2 structure derived from the $L2_1$ structure. In the B2 structure, elements accommodated at Y sites and elements accommodated at Z sites are mixed and elements accommodated at X sites are fixed. FIG. 2C is referred to as an A2 structure derived from the $L2_1$ structure. In the A2 structure, elements accommodated at X sites, elements accommodated at Y sites, and elements accommodated at Z sites are mixed.

FIG. 2D is referred to as a $C1_b$ structure. In the $C1_b$ structure, elements accommodated at X sites, elements accommodated at Y sites, and elements accommodated at Z sites are fixed. FIG. 2E is referred to as a B2 structure derived from the $C1_b$ structure. In the B2 structure, elements accommodated at Y sites and elements accommodated at Z sites are mixed and elements accommodated at X sites are fixed. FIG. 2F is referred to as an A2 structure derived from the $C1_b$ structure. In the A2 structure, elements accommodated at X sites, elements accommodated at Y sites, and elements accommodated at Z sites are mixed.

In a full-Heusler alloy, the crystallinity decreases in the order of $L2_1$ structure>B2 structure>A2 structure and in the half-Heusler alloy, the crystallinity decreases in the order of $C1_b$ structure>B2 structure>A2 structure. Although these crystal structures differ in quality of crystal structure, they are all crystals. Thus, each of the first layers 1A and 2A has, for example, any of the above-described crystal structures. The crystal structure of each of the first layers 1A and 2A is, for example, an $L2_1$ structure or a B2 structure.

It is possible to determine whether or not the Heusler alloy is crystallized by a transmission electron microscope (TEM) image (for example, a high-angle scattering annular dark-field scanning transmission electron microscope image: HAADF-STEM image) or an electron diffraction image using a transmission electron beam. When the Heusler alloy is crystallized, it is possible to confirm a state in which atoms are regularly arranged in the HAADF-STEM image taken by TEM, for example. More specifically, spots derived from the crystal structure of the Heusler alloy appear in the Fourier transform image of the HAADF-STEM image. Further, when the Heusler alloy is crystallized, diffraction spots from at least one of the (001) plane, the (002) plane, the (110) plane, and the (111) plane can be confirmed in the electron diffraction image. If crystallization can be confirmed by at least one of the means, it can be said that at least a part of the Heusler alloy is crystallized.

The composition analysis of each layer constituting the magnetoresistance effect element can be performed by using energy dispersive X-ray analysis (EDS). Further, for example, the composition distribution of each material in the film thickness direction can be confirmed by performing EDS line analysis.

A Co-based Heusler alloy is a Heusler alloy with Co at the X sites. Y is a transition metal from the Mn, V, Cr, or Ti groups or a transition metal element or noble metal element from the Co, Fe, Ni, or Cu groups, and Z is a typical element from Groups III to V. The Y element is preferably one or more elements selected from a group consisting of Fe, Mn, and Cr and the Z element is preferably one or more elements selected from a group consisting of Si, Al, Ga, and Ge.

The full-Heusler alloys are, for example, $Co_2FeSi$, $Co_2FeGe$, $Co_2FeGa$, $Co_2FeAl$, $Co_2FeGe_xGa_{1-x}$, $Co_2MnSi$, $Co_2MnGe$, $Co_2MnGa$, $Co_2MnSn$, $Co_2MnAl$, $Co_2CrAl$, $Co_2VAl$, $Co_2Mn_{1-a}Fe_aAl_bSi_{1-b}$, and the like. The half-Heusler alloys are, for example, CoFeSb, NiMnSe, NiMnTe, NiMnSb, PtMnSb, PdMnSb, CoFeSb, RhMnSb, CoMnSb, IrMnSb, and NiCrSb.

The Co-based Heusler alloy constituting the first layers 1A and 2A is represented by, for example, $Co_2Y_\alpha Z_\beta$. The Co-based full-Heusler alloy with a stoichiometric composition is represented by $Co_2YZ$. The CO composition ratio of the Co-based Heusler alloy constituting the first layers 1A and 2A is preferably smaller than the stoichiometric composition. That is, it is preferable that $\alpha+\beta>2$ be satisfied when the Co-based Heusler alloy is a full-Heusler alloy. When the Co-based Heusler alloy is a half-Heusler alloy, the Co-based Heusler alloy constituting the first layers 1A and 2A is represented by, for example, $CoY_\alpha Z_\beta$ and $\alpha+\beta>1$ is preferably satisfied.

When the Co composition ratio is relatively smaller than the element of the Y site, antisites in which the element of the Y site is replaced with the element of the X site (site containing Co) can be avoided. Antisites cause fluctuation in the Fermi levels in a Heusler alloy. When the Fermi levels fluctuate, the half-metal characteristics of the Heusler alloy deteriorate and the spin polarization decreases. A decrease in spin polarization causes a decrease in the MR ratio of the magnetoresistance effect element 10.

Each of the second layers 1B and 2B includes a crystallized part. Further, each of the second layers 1B and 2B may contain an alloy containing a ferromagnetic element, boron, and an additive element. The second layer may include an element other than the ferromagnetic element, boron and the additive element. Each of the second layers 1B and 2B may be made of, for example, an alloy of a ferromagnetic element, boron, and an additive element and at least a part of the ferromagnetic element, the boron, and the additive element may be crystallized. For example, the second layers 1B and 2B may be all crystallized or may contain the ferromagnetic element, boron, and the additive element, respectively.

The ferromagnetic element is at least one magnetic element selected from a group consisting of, for example, Cr, Mn, Co, Fe, and Ni. The additive element A is any element selected from a group consisting of Ti, V, Cr, Cu, Zn, Zr, Mo, Ru, Pd, Ta, W, Ir, Pt, and Au.

The alloy containing the ferromagnetic element, boron, and the additive element may be, for example, CoFeB-A, and CoFeGaGeB-A. CoFeB-A is a CoFeB alloy to which the element A is added as the additive element. CoFeGaGeB-A is a CoFeGaGeB alloy to which the element A is added as the additive element. In other words, the element A is an example of the additive element. The element A may invade the crystal structure of CoFeB or may replace any element of the crystal of CoFeB. The element A is preferably any element selected from a group consisting of Ti, Ru, and Ta, and is particularly preferably Ta.

The element A has a property of attracting boron. Regarding the element A, Ti, Ru, and Ta exhibit this property particularly strongly. Although the details will be described later, when the second layers 1B and 2B contain the element A, boron moves in the second layers 1B and 2B during heating and promotes the crystallization of the second layers 1B and 2B.

The content of the element A in the second layers 1B and 2B is larger than, for example, the content of boron. The content of the element A is, for example, 0.1 or more in the compositional proportion of CoFeB-A. When a sufficient amount of the element A is present, the element A adsorbs the boron in the second layers 1B and 2B in proportion. As a result, the diffusion of boron from the second layers 1B and 2B to the first layers 1A and 2A can be suppressed. When the first layers 1A and 2A contain boron, the crystallinity of the first layers 1A and 2A decreases so that a decrease in the MR ratio may be caused.

When the second layers 1B and 2B are crystallized CoFeB-A, the content of Fe in the second layers 1B and 2B is larger than, for example, the content of Co. When the content of Fe in the second layers 1B and 2B increases, it is possible to suppress the diffusion of the Co element in the first layers 1A and 2A to the second layers 1B and 2B during annealing. Since the Co element in the first layers 1A and 2A does not diffuse from the X site, the crystal structure of the first layers 1A and 2A becomes one of an $L2_1$ structure, a $C1_b$ structure, and a B2 structure. The $L2_1$ structure, the $C1_b$ structure, and the B2 structure have high crystallinity and the magnetoresistance effect element 10 including the first layers 1A and 2A of the crystal structure exhibits a large MR ratio.

The non-magnetic layer 3 is made of, for example, a non-magnetic metal. The non-magnetic layer 3 is, for example, a metal or alloy containing any element selected from a group consisting of Cu, Au, Ag, Al, and Cr. The non-magnetic layer 3 contains, for example, any element selected from a group consisting of Cu, Au, Ag, Al, and Cr as a main constituent element. The main constituent element means that the proportion of Cu, Au, Ag, Al, and Cr in the composition formula is 50% or more. The non-magnetic layer 3 preferably contains Ag, and preferably contains Ag as a main constituent element. Since Ag has a long spin diffusion length, in such a case, the magnetoresistance effect element 10 using Ag exhibits a large MR ratio.

The thickness of the non-magnetic layer 3 is, for example, in the range of 1 nm or more and 10 nm or less. The non-magnetic layer 3 inhibits the magnetic coupling between the first ferromagnetic layer 1 and the second ferromagnetic layer 2.

The non-magnetic layer 3 may be an insulator or a semiconductor. The non-magnetic insulator is, for example, $Al_2O_3$, $SiO_2$, MgO, $MgAl_2O_4$, and a material in which some of these Al, Si, and Mg are replaced with Zn, Be, and the like. These materials have a large band gap and excellent insulation. When the non-magnetic layer 3 is made of a non-magnetic insulator, the non-magnetic layer 3 is a tunnel barrier layer. The non-magnetic semiconductors are, for example, Si, Ge, $CuInSe_2$, $CuGaSe_2$, $Cu(In, Ga)Se_2$, and the like.

Next, a method of manufacturing the magnetoresistance effect element 10 will be described. The method of manufacturing the magnetoresistance effect element 10 includes a film formation step of each layer and an annealing step after the film formation step. In the annealing step, a ferromagnetic element, boron, and an element A are crystallized.

Figure 3:
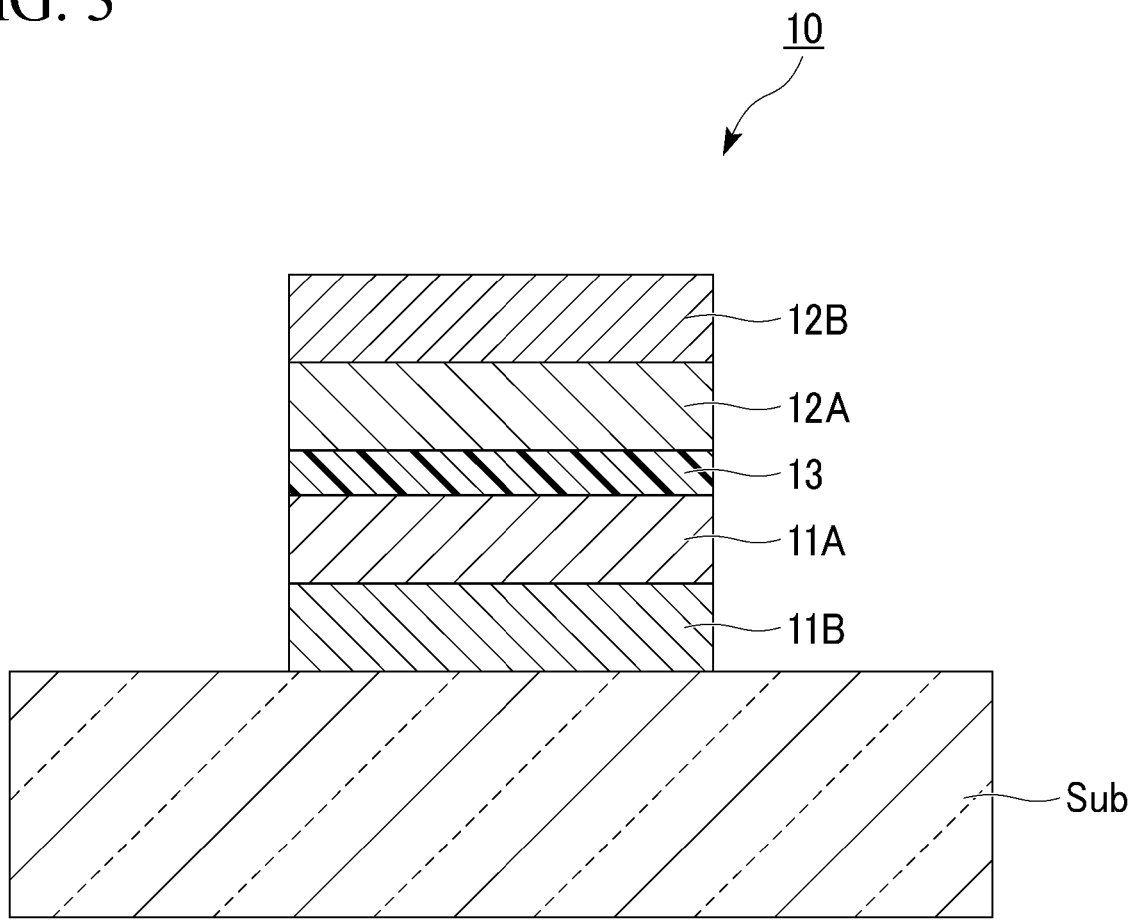
FIG. 3 is a cross-sectional view illustrating a method of manufacturing the magnetoresistance effect element according to the first embodiment.

FIG. 3 is a schematic diagram illustrating a method of manufacturing the magnetoresistance effect element 10 according to the first embodiment. First, a substrate Sub which is a base for film formation is prepared. The substrate Sub may be crystalline or amorphous. Examples of the crystalline substrate include a metal oxide single crystal, a silicon single crystal, and a sapphire single crystal. Examples of the amorphous substrate include a silicon single crystal with a thermal oxide film, ceramic, and quartz glass.

Next, a second layer 11B, a first layer 11A, a non-magnetic layer 13, a first layer 12A, and a second layer 12B are sequentially laminated on the substrate Sub. These layers are formed by, for example, a sputtering method.

Both the second layers 11B and 12B are made of an alloy containing the ferromagnetic element, the boron, and the element A. Both the second layers 11B and 12B are amorphous at the time after film formation. Both the first layers 11A and 12A are the Co-based Heusler alloys. Since the first layers 11A and 12A grow on an amorphous base, they grow in the direction in which they are likely to grow (110). Therefore, the first layers 11A and 12A are crystals having low crystallinity. The non-magnetic layer 13 is made of the same material as that of the non-magnetic layer 3.

Next, a laminated body laminated on the substrate Sub is annealed. The annealing temperature is, for example, 300° C. or less and, for example, 250° C. or more and 300° C. or less.

When the laminated body is annealed, in the second layers 11B and 12B, the boron contained in the ferromagnetic element, the boron, and the element A is attracted to the element A. The boron is attracted to the element A and is diffused in the second layers 11B and 12B. The boron mixes the atoms in the second layers 11B and 12B during the diffusion in the second layers 11B and 12B. The mixed atoms are rearranged and the second layers 11B and 12B are crystallized.

Both the second layers 11B and 12B have a bcc type crystal structure. In the step of forming each of the second layers 11B and 12B into the bcc type crystal structure, the atoms contained in the first layers 11A and 12A are also rearranged. The atoms contained in the first layers 11A and 12A are rearranged under the influence of the crystal structure of the adjacent second layer 11B or 12B and the first layers 11A and 12A are respectively crystallized. That is, each of the first layers 11A and 12A is influenced by the crystallization of the second layers 11B and 12B and the regularization thereof progresses such they become highly crystalline crystals.

As described above, when the laminated body is annealed, the second layers 11B and 12B are crystallized to become the second layers 1B and 2B and the first layers 11A and 12A are crystallized to become the first layers 1A and 2A. Further, the non-magnetic layer 13 becomes the non-magnetic layer 3. As a result, the magnetoresistance effect element 10 shown in FIG. 1 can be obtained.

As described above, when the method of manufacturing the magnetoresistance effect element 10 according to the embodiment is used, the Heusler alloy can be crystallized regardless of the crystal structure of the base. Here, one of the processes of the method of manufacturing the magnetoresistance effect element 10 has been introduced, but the above-described method can be also be applied to the method of crystallizing a single ferromagnetic layer. For example, a crystalline Heusler alloy can be obtained by laminating a layer of an alloy containing a ferromagnetic element, boron, and an element A and a ferromagnetic layer containing a Heusler alloy and heating these.

In the method of manufacturing the magnetoresistance effect element 10 according to the embodiment, the first ferromagnetic layer 1 and the second ferromagnetic layer 2 are crystallized at a low temperature of 300° C. or less. If the temperature is 300° C. or less, adverse effects on other components (for example, magnetic shield) can be reduced even if annealing is performed after manufacturing other components of the magnetic head, for example.

Thus, the annealing timing is not limited and an element such as a magnetic head is easily manufactured.

Further, in the magnetoresistance effect element 10 according to the embodiment, the first ferromagnetic layer 1 and the second ferromagnetic layer 2 sandwiching the non-magnetic layer 3 are crystallized. Therefore, the first ferromagnetic layer 1 and the second ferromagnetic layer 2 exhibit high spin polarization. As a result, the magnetoresistance effect element 10 according to the embodiment exhibits a large MR ratio.

Although the embodiments of the present invention have been described in detail with reference to the drawings, each configuration and their combination in each embodiment is an example and the configuration can be added, omitted, replaced, and modified into other forms in the scope not departing from the spirit of the present invention.

Figure 4:
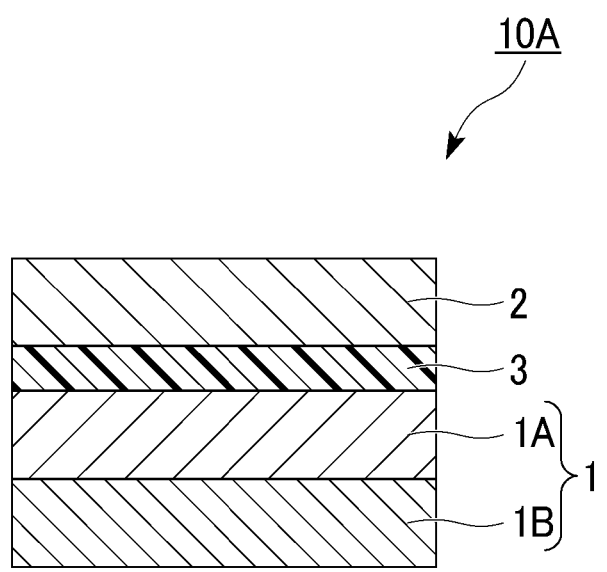
FIG. 4 is a cross-sectional view of a magnetoresistance effect element according to a first modified example of the first embodiment.

For example, FIG. 4 is a cross-sectional view of a magnetoresistance effect element 10A according to a first modified example. In the magnetoresistance effect element 10A shown in FIG. 4, only the first ferromagnetic layer 1 includes the first layer 1A and the second layer 1B. In FIG. 4, an example is shown in which only the first ferromagnetic layer 1 includes the first layer and the second layer, but only the second ferromagnetic layer 2 may include the first layer and the second layer. In this case, the remaining one ferromagnetic layer may be, for example, a metal selected from a group consisting of Cr, Mn, Co, Fe, and Ni, an alloy containing one or more of these metals, an alloy containing these metals and at least one element of B, C, and N, or a Heusler alloy. For example, the composition of the remaining one ferromagnetic layer is Co—Fe or Co—Fe—B.

Further, for example, the magnetoresistance effect element may include a layer other than the first ferromagnetic layer 1, the second ferromagnetic layer 2, and the non-magnetic layer 3.

Figure 5:
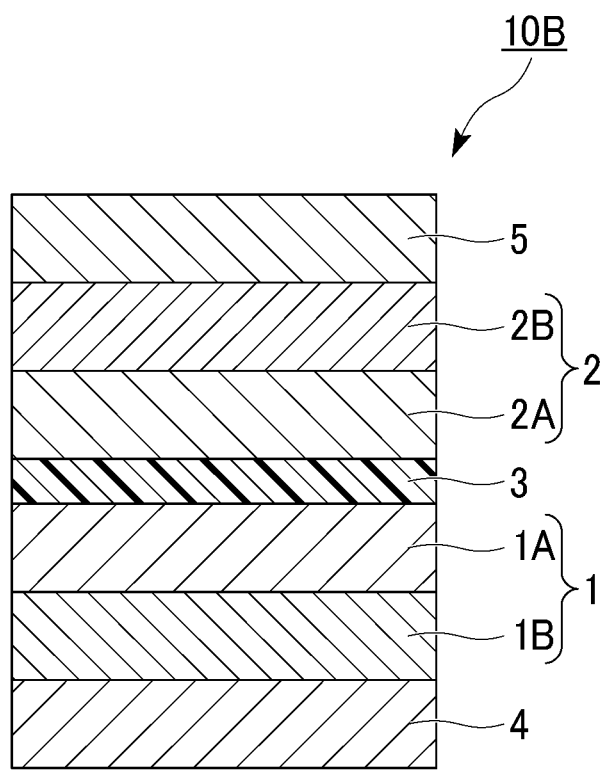
FIG. 5 is a cross-sectional view of a magnetoresistance effect element according to a second modified example of the first embodiment.

FIG. 5 is a cross-sectional view of a magnetoresistance effect element 10B according to a second modified example. The magnetoresistance effect element 10B shown in FIG. 5 is different from the magnetoresistance effect element 10 shown in FIG. 1 in that boron absorbing layers 4 and 5 are provided.

The boron absorbing layers 4 and 5 are non-magnetic layers. Each of the boron absorbing layers 4 and 5 contains boron and any element selected from a group consisting of Ti, V, Cr, Cu, Zn, Zr, Mo, Ru, Pd, Ta, W, Ir, Pt, and Au. Hereinafter, Ti, V, Cr, Cu, Zn, Zr, Mo, Ru, Pd, Ta, W, Ir, Pt, and Au are the same as the element A. However, the element A contained in the boron absorbing layers 4 and 5 does not need to be the same as the element A contained in the second layers 1B and 2B.

The boron absorbing layers 4 and 5 are, for example, those obtained by adding boron to a metal or alloy made of an element A. The boron absorbing layers 4 and 5 preferably contain any element selected from a group consisting of Ti, Ru, and Ta in the A element. The boron absorbing layers 4 and 5 are obtained by adding boron or carbon to, for example, a metal or alloy containing any element selected from a group consisting of Ti, Ru, and Ta.

The boron absorbing layers 4 and 5 do not contain, for example, boron during the film formation step. That is, the boron absorbing layers 4 and 5 before the annealing step are, for example, a metal or alloy of the element A. As described above, the element A has a property of attracting boron. In the boron absorbing layers 4 and 5, the element A attracts boron at the time of annealing and contains boron.

The boron absorbing layers 4 and 5 suppress the diffusion of boron to the first layers 1A and 2A and the non-magnetic layer 3 at the time of annealing. When the first layers 1A and 2A contain boron, the crystallinity of the first layers 1A and 2A decreases and the MR ratio of the magnetoresistance effect element 10 decreases. When the non-magnetic layer 3 contains boron, the crystallinity of the non-magnetic layer 3 decreases and the MR ratio of the magnetoresistance effect element 10B decreases. That is, the boron absorbing layers 4 and 5 suppress a decrease in the MR ratio of the magnetoresistance effect element 10B by preventing the diffusion of boron contained in the second layers 1B and 2B to the first layers 1A and 2A and the non-magnetic layer 3.

Figure 6:
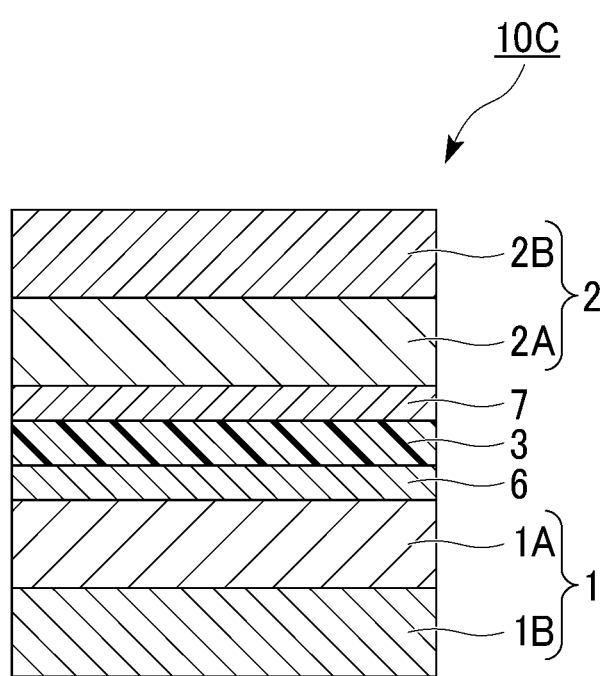
FIG. 6 is a cross-sectional view of a magnetoresistance effect element according to a third modified example of the first embodiment.

FIG. 6 is a cross-sectional view of a magnetoresistance effect element 10C according to a third modified example. The magnetoresistance effect element 10C shown in FIG. 6 is different from the magnetoresistance effect element 10 shown in FIG. 1 in that the buffer layers 6 and 7 are provided.

Each of the buffer layers 6 and 7 is a layer containing a NiAl alloy or Ni. The buffer layer 6 is a buffer layer which alleviates the lattice unconformity between the first ferromagnetic layer 1 and the non-magnetic layer 3. The buffer layer 7 is a buffer layer which alleviates the lattice unconformity between the non-magnetic layer 3 and the second ferromagnetic layer 2.

A thickness t of each of the buffer layers 6 and 7 is, for example, $0<t\leq0.63$ nm. When the thickness t is too thick, there is concern that spins may be scattered in the electrons moving from the first ferromagnetic layer 1 (or the second ferromagnetic layer 2) to the second ferromagnetic layer 2 (or the first ferromagnetic layer 1). Since the thickness t is within this range, spin scattering is suppressed in the moving electrons, the lattice unconformity between the first ferromagnetic layer 1 and the non-magnetic layer 3 decreases, and the lattice unconformity between the non-magnetic layer 3 and the second ferromagnetic layer 2 decreases. When the lattice unconformity of each layer becomes small, the MR ratio of the magnetoresistance effect element 10C is improved. An example, in which the magnetoresistance effect element 10C include both of the buffer layers 6, 7, is shown in FIG. 6. However, the magnetoresistance effect element 10C may include only at least one of the buffer layers 6, 7.

Although the first to third modified examples are shown as described above, these are also an example of the magnetoresistance effect element according to this embodiment. For example, the characteristic configurations of the first to third modified examples may be combined.

The magnetoresistance effect elements 10, 10A, 10B, and 10C can be used for various applications. The magnetoresistance effect elements 10, 10A, 10B, and 10C can be applied to, for example, a magnetic head, a magnetic sensor, a magnetic memory, a high-frequency filter, and the like.

Next, application examples of the magnetoresistance effect element according to the embodiment will be described. Additionally, in the following application examples, the magnetoresistance effect element 10 is used as the magnetoresistance effect element, but the magnetoresistance effect element is not limited thereto.

Figure 7:
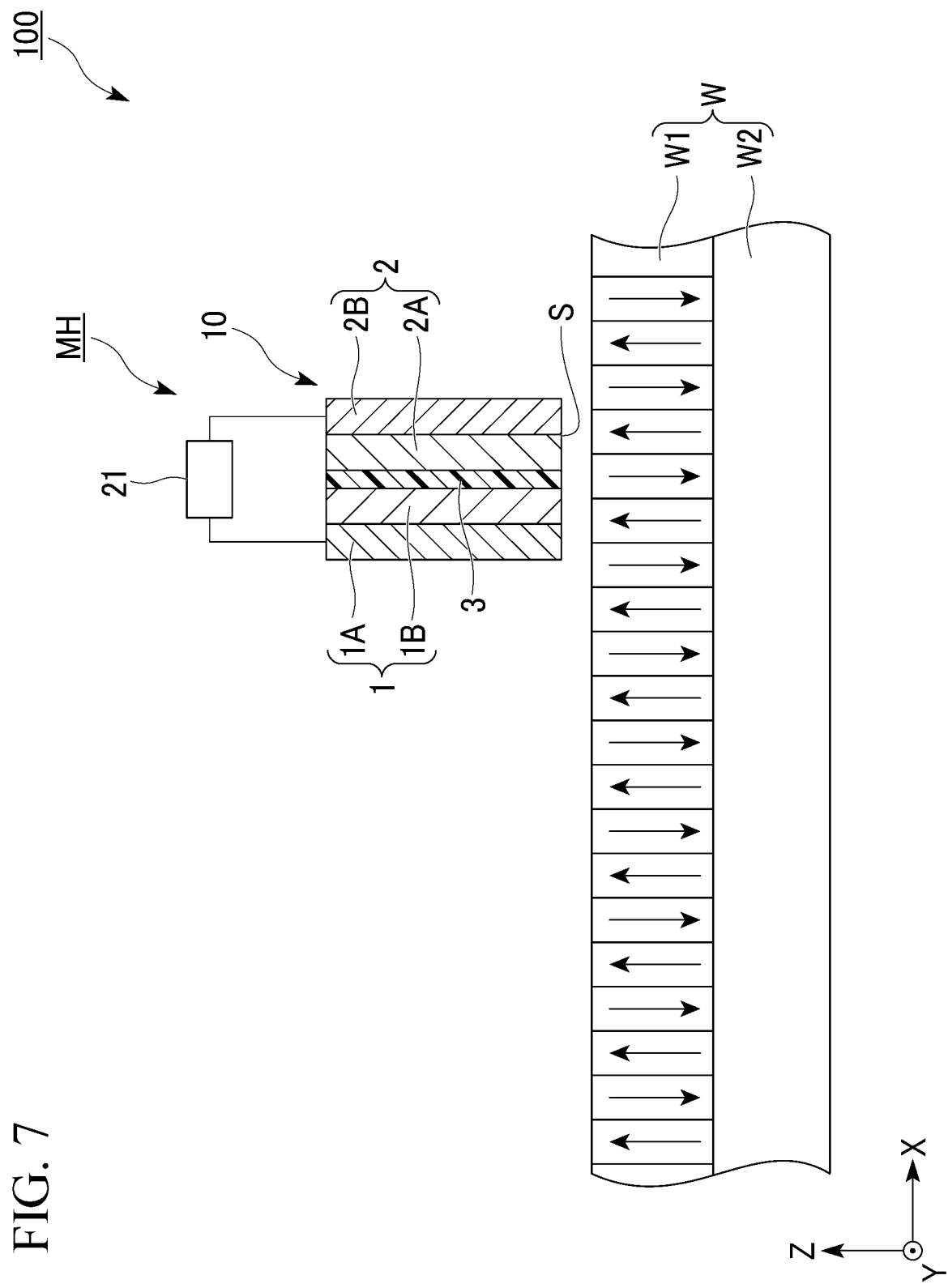
FIG. 7 is a cross-sectional view of a magnetic recording element according to Application Example 1.

FIG. 7 is a cross-sectional view of a magnetic recording element 100 according to Application Example 1. FIG. 7 is a cross-sectional view in which the magnetoresistance effect element 10 is cut along the lamination direction.

As shown in FIG. 7, the magnetic recording element 100 includes a magnetic head MH and a magnetic recording medium W. In FIG. 7, one direction in which the magnetic recording medium W extends is referred to as the X direction and a direction perpendicular to the X direction is referred to as the Y direction. The XY plane is parallel to a main plane of the magnetic recording medium W. A direction which connects the magnetic recording medium W and the magnetic head MH and is perpendicular to the XY plane is referred to as the Z direction.

In the magnetic head MH, an air bearing surface (medium facing surface) S faces the surface of the magnetic recording medium W. The magnetic head MH moves in the directions indicated by an arrow +X and an arrow −X along the surface of the magnetic recording medium W at a position separated from the magnetic recording medium W by a constant distance. The magnetic head MH includes the magnetoresistance effect element 10 which acts as a magnetic sensor and a magnetic recording unit (not shown). A resistance measuring instrument 21 measures the resistance value of the magnetoresistance effect element 10 in the lamination direction.

The magnetic recording unit applies a magnetic field to a recording layer W1 of the magnetic recording medium W and determines the magnetization direction of the recording layer W1. That is, the magnetic recording unit performs magnetic recording of the magnetic recording medium W. The magnetoresistance effect element 10 reads information of the magnetization of the recording layer W1 written by the magnetic recording unit.

The magnetic recording medium W includes a recording layer W1 and a backing layer W2. The recording layer W1 is a part for performing magnetic recording and the backing layer W2 is a magnetic path (magnetic flux passage) for returning the magnetic flux for recording to the magnetic head MH again. The recording layer W1 records the magnetic information as the magnetization direction.

The second ferromagnetic layer 2 of the magnetoresistance effect element 10 is, for example, a magnetization free layer. Therefore, the second ferromagnetic layer 2 exposed to the air bearing surface S is affected by the magnetization recorded on the recording layer W1 of the facing magnetic recording medium W. For example, in FIG. 7, the magnetization direction of the second ferromagnetic layer 2 is affected by the magnetization facing the +z direction of the recording layer W1 and faces the +z direction. In this case, the magnetization directions of the first ferromagnetic layer 1 which is the magnetization fixed layer and the second ferromagnetic layer 2 are parallel.

Here, the resistance when the magnetization directions of the first ferromagnetic layer 1 and the second ferromagnetic layer 2 are parallel is different from the resistance when the magnetization directions of the first ferromagnetic layer 1 and the second ferromagnetic layer 2 are antiparallel. The MR ratio of the magnetoresistance effect element 10 becomes larger as the difference between the resistance value in the parallel case and the resistance value in the antiparallel case becomes larger. The magnetoresistance effect element 10 according to the embodiment contains a crystallized Heusler alloy and has a large MR ratio. Thus, the information of the magnetization of the recording layer W1 can be accurately read as a change in the resistance value by the resistance measuring instrument 21.

The shape of the magnetoresistance effect element 10 of the magnetic head MH is not particularly limited. For example, the first ferromagnetic layer 1 may be installed at a position separated from the magnetic recording medium W in order to avoid the influence of the leakage magnetic field of the magnetic recording medium W with respect to the first ferromagnetic layer 1 of the magnetoresistance effect element 10.

Figure 8:
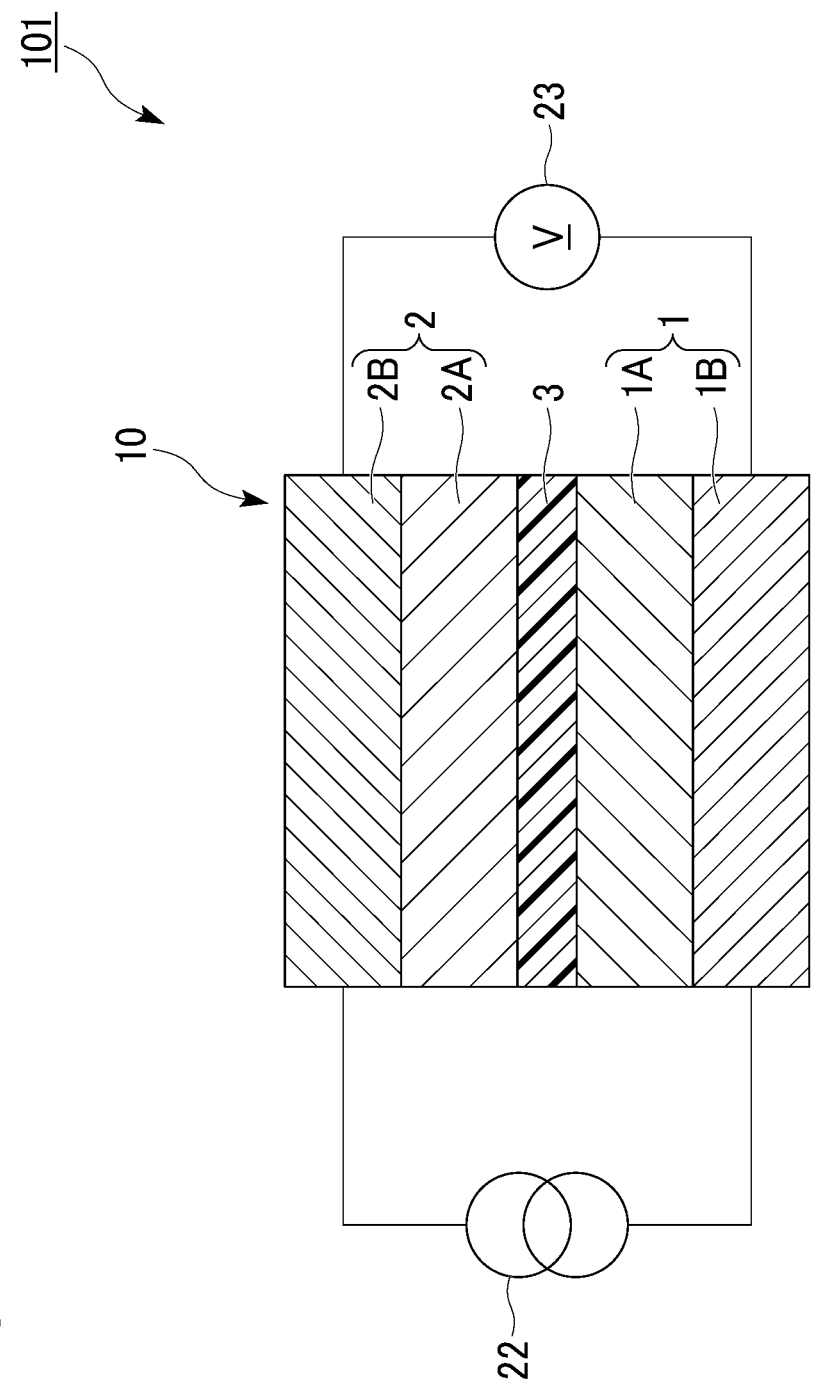
FIG. 8 is a cross-sectional view of a magnetic recording element according to Application Example 2.

FIG. 8 is a cross-sectional view of a magnetic recording element 101 according to Application Example 2. FIG. 8 is a cross-sectional view in which the magnetic recording element 101 is cut along the lamination direction.

As shown in FIG. 8, the magnetic recording element 101 includes the magnetoresistance effect element 10, a power supply 22, and a measurement unit 23. The power supply 22 gives a potential difference to the magnetoresistance effect element 10 in the lamination direction. The power supply 22 is, for example, a DC power supply. The measurement unit 23 measures the resistance value of the magnetoresistance effect element 10 in the lamination direction.

When a potential difference is generated between the first ferromagnetic layer 1 and the second ferromagnetic layer 2 by the power supply 22, a current flows in the lamination direction of the magnetoresistance effect element 10. The current is spin-polarized when passing through the first ferromagnetic layer 1 and becomes a spin-polarized current. The spin-polarized current reaches the second ferromagnetic layer 2 through the non-magnetic layer 3. The magnetization of the second ferromagnetic layer 2 is reversed by receiving spin transfer torque (STT) due to the spin-polarized current. As the relative angle between the magnetization direction of the first ferromagnetic layer 1 and the magnetization direction of the second ferromagnetic layer 2 changes, the resistance value in the lamination direction of the magnetoresistance effect element 10 changes. The resistance value in the lamination direction of the magnetoresistance effect element 10 is read by the measurement unit 23. That is, the magnetic recording element 101 shown in FIG. 8 is a spin transfer torque (STT) type magnetic recording element.

Since the magnetic recording element 101 shown in FIG. 8 includes the magnetoresistance effect element 10 which contains a crystallized Heusler alloy and has a large MR ratio, data can be accurately recorded.

Figure 9:
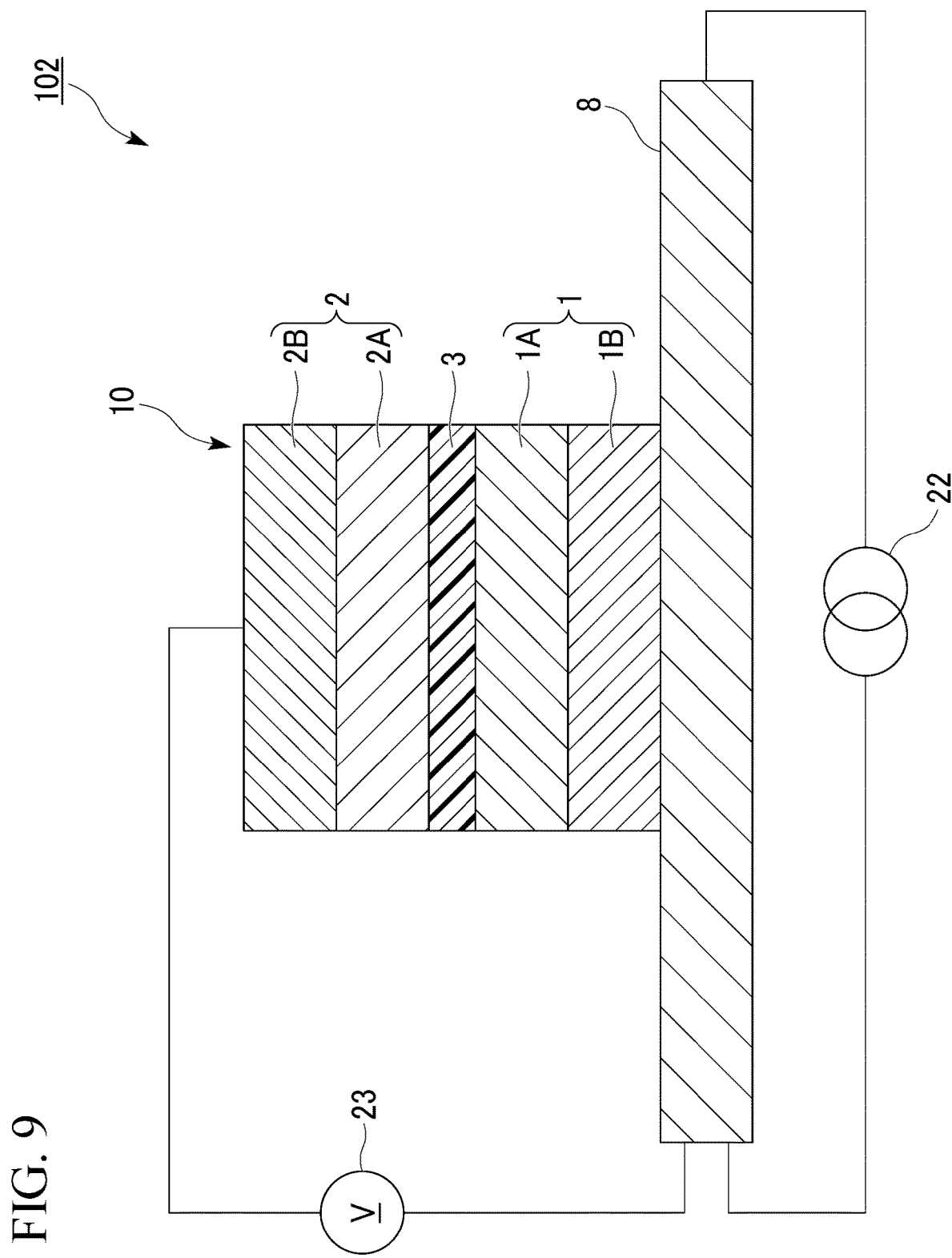
FIG. 9 is a cross-sectional view of a magnetic recording element according to Application Example 3.

FIG. 9 is a cross-sectional view of a magnetic recording element 102 according to Application Example 3. FIG. 9 is a cross-sectional view in which the magnetic recording element 102 is cut along the lamination direction.

As shown in FIG. 9, the magnetic recording element 102 includes the magnetoresistance effect element 10, a spin-orbit torque wiring 8, the power supply 22, and the measurement unit 23. The spin-orbit torque wiring 8 is joined to, for example, the second layer 1B of the first ferromagnetic layer 1. The spin-orbit torque wiring 8 extends in one direction of the in-plane direction. The power supply 22 is connected to a first end and a second end of the spin-orbit torque wiring 8. The first end and the second end sandwich the magnetoresistance effect element 10 in the plan view. The power supply 22 causes a write current to flow along the spin-orbit torque wiring 8. The measurement unit 23 measures the resistance value in the lamination direction of the magnetoresistance effect element 10.

When a potential difference is generated between the first end and the second end of the spin-orbit torque wiring 8 by the power supply 22, a current flows in the in-plane direction of the spin-orbit torque wiring 8. The spin-orbit torque wiring 8 has a function of generating a spin current by the spin Hall effect when a current flows. The spin-orbit torque wiring 8 contains, for example, any one of a metal, an alloy, an intermetallic compound, a metal boride, a metal carbide, a metal silicate, and a metal phosphate having a function of generating a spin current by the spin Hall effect when a current flows. For example, the wiring contains a non-magnetic metal having an atomic number of 39 or more having d electrons or f electrons in the outermost shell.

When a current flows in the in-plane direction of the spin-orbit torque wiring 8, a spin Hall effect is generated by the spin-orbit interaction. The spin Hall effect is a phenomenon in which a moving spin is bent in a direction orthogonal to the current flow direction. The spin Hall effect causes uneven distribution of spins in the spin-orbit torque wiring 8 and induces a spin current in the thickness direction of the spin-orbit torque wiring 8. Spin is injected from the spin-orbit torque wiring 8 into the first ferromagnetic layer 1 by the spin current.

The spin injected into the first ferromagnetic layer 1 gives spin-orbit torque (SOT) to the magnetization of the first ferromagnetic layer 1. The first ferromagnetic layer 1 receives the spin-orbit torque (SOT) and reverses the magnetization. In this case, the first ferromagnetic layer 1 becomes a magnetization free layer and the second ferromagnetic layer 2 becomes a magnetization fixed layer. As the magnetization direction of the first ferromagnetic layer 1 and the magnetization direction of the second ferromagnetic layer 2 change, the resistance value in the lamination direction of the magnetoresistance effect element 10 changes. The resistance value in the lamination direction of the magnetoresistance effect element 10 is read by the measurement unit 23. That is, the magnetic recording element 102 shown in FIG. 9 is a spin orbit-torque (SOT) type magnetic recording element.

Since the magnetic recording element 102 shown in FIG. 9 includes the magnetoresistance effect element 10 containing a crystallized Heusler alloy and having a large MR ratio, data can be accurately recorded.

Figure 10:
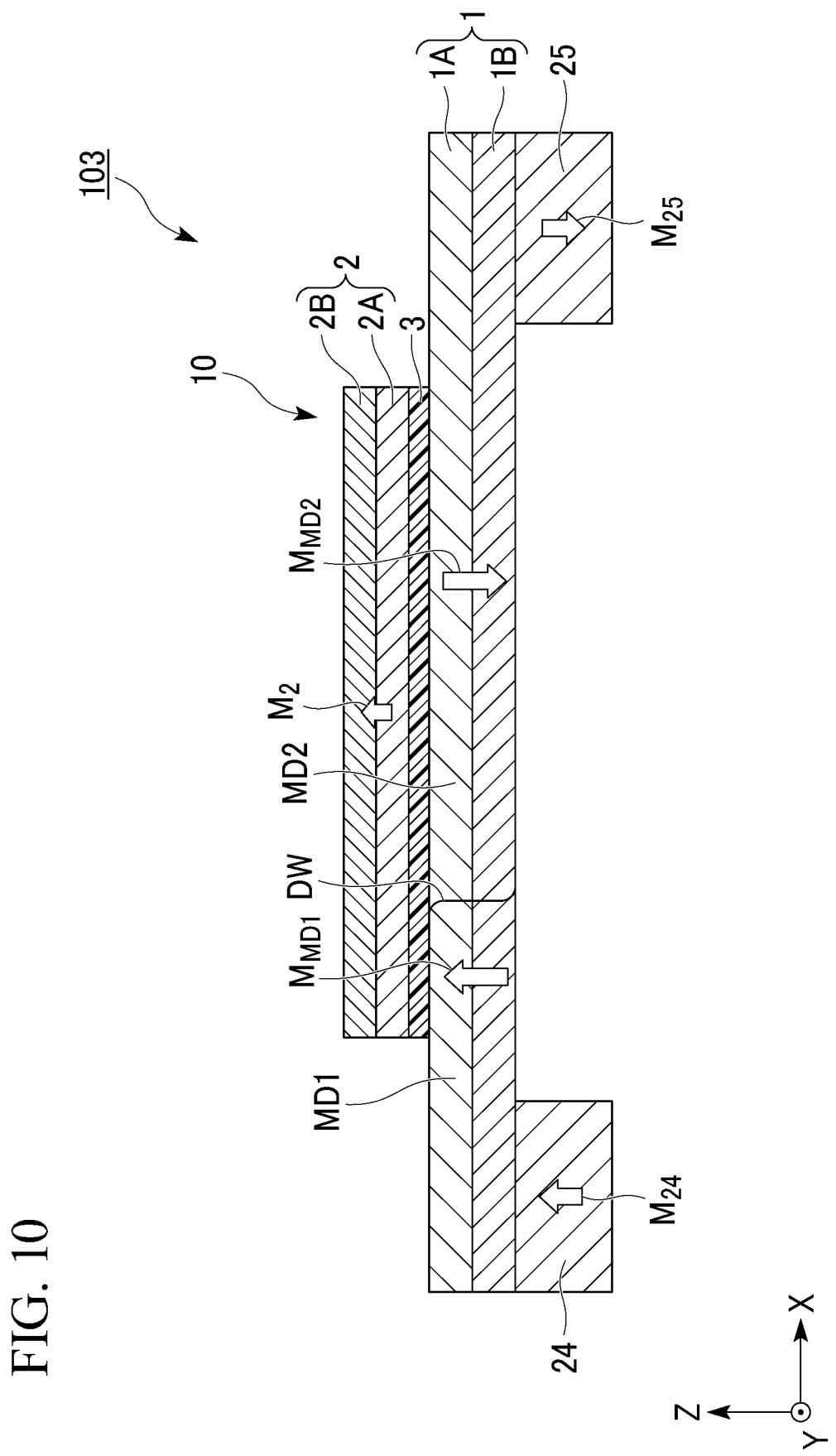
FIG. 10 is a cross-sectional view of a magnetic domain wall movement element according to Application Example 4.

FIG. 10 is a cross-sectional view of a magnetic domain wall movement element (a magnetic domain wall movement type magnetic recording element) according to Application Example 4. A magnetic domain wall movement element 103 includes the magnetoresistance effect element 10, a first magnetization fixed layer 24, and a second magnetization fixed layer 25. The magnetoresistance effect element 10 includes the first ferromagnetic layer 1, the second ferromagnetic layer 2, and the non-magnetic layer 3. In FIG. 10, a direction in which the first ferromagnetic layer 1 extends is the X direction, a direction perpendicular to the X direction is the Y direction, and a direction perpendicular to the XY plane is the Z direction.

The first magnetization fixed layer 24 and the second magnetization fixed layer 25 are connected to the first end and the second end of the first ferromagnetic layer 1. The first end and the second end sandwich the second ferromagnetic layer 2 and the non-magnetic layer 3 in the X direction.

The first ferromagnetic layer 1 is a layer capable of magnetically recording information by changing the internal magnetic state. The first ferromagnetic layer 1 includes a first magnetic domain MD1 and a second magnetic domain MD2 therein. The magnetization at a position overlapping the first magnetization fixed layer 24 or the second magnetization fixed layer 25 in the Z direction in the first ferromagnetic layer 1 is fixed in one direction. The magnetization at a position overlapping the first magnetization fixed layer 24 in the Z direction is fixed, for example, in the +Z direction and the magnetization at a position overlapping the second magnetization fixed layer 25 in the Z direction is fixed, for example, in the −Z direction. As a result, a magnetic domain wall DW is formed at the boundary between the first magnetic domain MD1 and the second magnetic domain MD2. The first ferromagnetic layer 1 can have the magnetic domain wall DW therein. In the first ferromagnetic layer 1 shown in FIG. 10, a magnetization $M_{MD1}$ of the first magnetic domain MD1 is oriented in the +Z direction and a magnetization $M_{MD2}$ of the second magnetic domain MD2 is oriented in the −Z direction.

The magnetic domain wall movement element 103 can record data in multiple values or continuously depending on the position of the domain wall DW of the first ferromagnetic layer 1. The data recorded in the first ferromagnetic layer 1 is read as a change in the resistance value of the magnetic domain wall movement element 103 when a write current is applied.

A ratio between the first magnetic domain MD1 and the second magnetic domain MD2 in the first ferromagnetic layer 1 changes when the magnetic domain wall DW moves. For example, the magnetization M2 of the second ferromagnetic layer 2 is the same direction as (parallel to) the magnetization $M_{MD1}$ of the first magnetic domain MD1 and is the direction opposite to (antiparallel to) the magnetization $M_{MD2}$ of the second magnetic domain MD2. When the magnetic domain wall DW moves in the +X direction and the area of the first magnetic domain MD1 in a portion overlapping the second ferromagnetic layer 2 in the plan view from the Z direction becomes wider, the resistance value of the magnetic domain wall movement element 103 decreases. In contrast, when the magnetic domain wall DW moves in the −X direction and the area of the second magnetic domain MD2 in a portion overlapping the second ferromagnetic layer 2 in the plan view from the Z direction becomes wider, the resistance value of the magnetic domain wall movement element 103 increases.

The magnetic domain wall DW moves by passing a write current in the X direction of the first ferromagnetic layer 1 or applying an external magnetic field. For example, when a write current (for example, a current pulse) is applied in the +X direction of the first ferromagnetic layer 1, electrons flow in the −X direction opposite to the current and hence the magnetic domain wall DW moves in the −X direction. When a current flows from the first magnetic domain MD1 toward the second magnetic domain MD2, the spin-polarized electrons in the second magnetic domain MD2 reverse the magnetization $M_{MD1}$ of the first magnetic domain MD1. Since the magnetization $M_{MD1}$ of the first magnetic domain MD1 is reversed, the magnetic domain wall DW moves in the −X direction.

Since the magnetic domain wall movement element 103 shown in FIG. 10 includes the magnetoresistance effect element 10 containing a crystallized Heusler alloy and has a large MR ratio, data can be accurately recorded.

Figure 11:
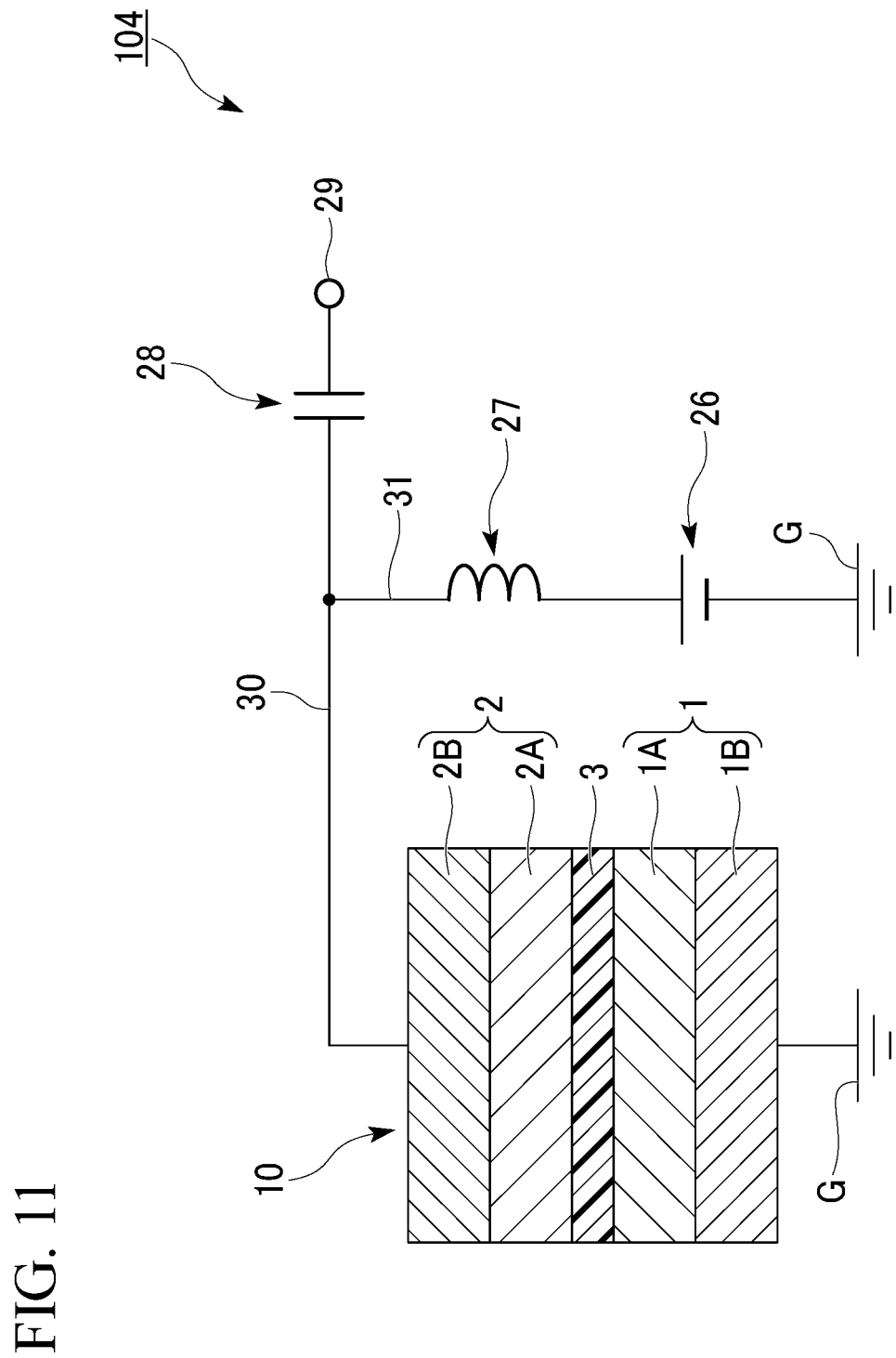
FIG. 11 is a cross-sectional view of a high frequency device according to Application Example 5.

FIG. 11 is a schematic diagram of a high frequency device 104 according to Application Example 5. As shown in FIG. 11, the high frequency device 104 includes the magnetoresistance effect element 10, a DC power supply 26, an inductor 27, a capacitor 28, an output port 29, and wirings 30 and 31.

The wiring 30 connects the magnetoresistance effect element 10 and the output port 29 to each other. The wiring 31 branches from the wiring 30 and reaches the ground G through the inductor 27 and the DC power supply 26. As the DC power supply 26, the inductor 27, and the capacitor 28, existing ones can be used. The inductor 27 cuts a high frequency component of the current and passes an invariant component of the current. The capacitor 28 passes a high frequency component of the current and cuts an invariant component of the current. The inductor 27 is disposed in a portion where the flow of the high-frequency current is desired to be suppressed and the capacitor 28 is disposed in a portion where the flow of the direct current is desired to be suppressed.

When an alternating current or an alternating magnetic field is applied to the ferromagnetic layer included in the magnetoresistance effect element 10, the magnetization of the second ferromagnetic layer 2 undergoes an aging motion. The magnetization of the second ferromagnetic layer 2 vibrates strongly when the frequency of the high-frequency magnetic field or the high-frequency current applied to the second ferromagnetic layer 2 is close to the ferromagnetic resonance frequency of the second ferromagnetic layer 2 and does not vibrate much at the frequency away from the ferromagnetic resonance frequency of the second ferromagnetic layer 2. This phenomenon is called a ferromagnetic resonance phenomenon.

The resistance value of the magnetoresistance effect element 10 changes due to the vibration of the magnetization of the second ferromagnetic layer 2. The DC power supply 26 applies a direct current to the magnetoresistance effect element 10. The direct current flows in the lamination direction of the magnetoresistance effect element 10. The direct current flows to a ground G through the wirings 30 and 31 and the magnetoresistance effect element 10. The potential of the magnetoresistance effect element 10 changes according to Ohm's law. A high-frequency signal is output from the output port 29 in response to a change in the potential of the magnetoresistance effect element 10 (a change in the resistance value).

Since the high frequency device 104 shown in FIG. 11 includes the magnetoresistance effect element 10 containing a crystallized Heusler alloy and having a large change range in resistance value, a high-frequency signal having a large output can be transmitted.

EXAMPLES

Example 1

The magnetoresistance effect element 10 shown in FIG. 1 was manufactured as Example 1. The first ferromagnetic layer 1 and the second ferromagnetic layer 2 respectively include the first layers 1A and 2A and the second layers 1B and 2B. The first layers 1A and 2A were crystallized Co-based Heusler alloys and the compositional proportion was $Co_2FeGa_{0.5}Ge_{0.5}$. The second layers 1B and 2B were crystallized CoFeB-A and the compositional proportion was $(Co_{0.4}Fe_{0.4}B_{0.2})_{0.9}Ta_{0.1}$. The non-magnetic layer 3 was Ag.

The magnetoresistance effect element 10 according to Example 1 was manufactured as below. First, the second layer 1B, the first layer 1A, the non-magnetic layer 3, the first layer 2A, and the second layer 2B having the above-described composition were formed on an amorphous substrate in this order by a sputtering method. At the time after the film formation, the first layers 1A and 2A were crystals with low crystallinity and the second layers 1B and 2B were amorphous.

Next, a laminated body was annealed. Annealing was performed at 300° C. for 10 hours. The second layers 1B and 2B were crystallized by annealing and the crystallinity of the first layers 1A and 2A was also improved with the crystallization of the second layers 1B and 2B.

The MR ratio and the RA (resistance area) of the manufactured magnetoresistance effect element 10 were measured. In the MR ratio, a change in the resistance value of the magnetoresistance effect element 10 was measured by monitoring a voltage applied to the magnetoresistance effect element 10 with a voltmeter while sweeping a magnetic field from the outside to the magnetoresistance effect element 10 in a state in which a constant current flows in the lamination direction of the magnetoresistance effect element 10. The resistance value when the magnetization directions of the first ferromagnetic layer 1 and the second ferromagnetic layer 2 were parallel and the resistance value when the magnetization directions of the first ferromagnetic layer 1 and the second ferromagnetic layer 2 were antiparallel were measured and the MR ratio was calculated from the obtained resistance values using the following formula. The MR ratio was measured at 300 K (room temperature).

$MR$ ratio $(\%)=(R_{AP}-R_P)/R_P \times 100$

RP indicates the resistance value when the magnetization directions of the first ferromagnetic layer 1 and the second ferromagnetic layer 2 are parallel and RAP indicates the resistance value when the magnetization directions of the first ferromagnetic layer 1 and the second ferromagnetic layer 2 are antiparallel.

RA was obtained by the product of the resistance $R_P$ when the magnetization directions of the first ferromagnetic layer 1 and the second ferromagnetic layer 2 were parallel and the area A in the in-plane direction of the magnetoresistance effect element 10.

The MR ratio of the magnetoresistance effect element 10 according to Example 1 was 11% and RA was 0.08 $\Omega \cdot \mu m^2$.

Example 2

Example 2 is different from Example 1 in that the composition of the first layers 1A and 2A is $Co_2FeGa_{0.6}Ge_{0.8}$. In the Co-based Heusler alloy constituting the first layers 1A and 2A according to Example 2, the Co compositional proportion is smaller than that of the stoichiometric composition.

The MR ratio of the magnetoresistance effect element 10 according to Example 2 was 14% and RA was 0.09 $\Omega \cdot \mu m^2$.

Example 3

Example 3 is different from Example 1 in that the composition of the second layers 1B and 2B is $(Co_{0.2}Fe_{0.6}B_{0.2})_{0.9}Ta_{0.1}$. In the second layers 1B and 2B according to Example 3, the content of Fe is larger than the content of Co.

The MR ratio of the magnetoresistance effect element 10 according to Example 3 was 13% and RA was 0.07 $\Omega \cdot \mu m^2$.

Example 4

Example 4 is different from Example 1 in that the composition of the first layers 1A and 2A is $Co_2FeGa_{0.6}Ge_{0.8}$ and the composition of the second layers 1B and 2B is $(Co_{0.2}Fe_{0.6}B_{0.2})_{0.9}Ta_{0.1}$. In the Co-based Heusler alloy constituting the first layers 1A and 2A according to Example 4, the Co compositional proportion is smaller than that of the stoichiometric composition and in the second layers 1B and 2B, the content of Fe is larger than the content of Co.

The MR ratio of the magnetoresistance effect element 10 according to Example 4 was 16% and RA was 0.08 $\Omega \cdot \mu m^2$.

Example 5

Example 5 is different from Example 1 in that the composition of the first layers 1A and 2A is $Co_2FeGa_{0.6}Ge_{0.8}$ and the composition of the second layers 1B and 2B is $(Co_{0.2}Fe_{0.65}B_{0.15})_{0.85}Ta_{0.15}$. In the Co-based Heusler alloy constituting the first layers 1A and 2A according to Example 5, the Co compositional proportion is smaller than that of the stoichiometric composition and in the second layers 1B and 2B, the content of Fe is larger than the content of Co. Further, the content of Ta in Example 5 is larger than those of Examples 1 to 4.

The MR ratio of the magnetoresistance effect element 10 according to Comparative Example 2 was 7% and RA was 0.08 $\Omega \cdot \mu m^2$.

The results of Examples 1 to 6 and the results of Comparative Examples 1 and 2 are summarized in Table 1 below.

TABLE 1

|  | FIRST LAYER | SECOND LAYER | RA | MR RATIO |
| --- | --- | --- | --- | --- |
| COMPARATIVE EXAMPLE 1 | $Co_2Fe_1Ga_{0.5}Ge_{0.5}$ (CRYSTAL) | $(Co_{0.4}Fe_{0.4}B_{0.2})_{0.93}Ta_{0.07}$ (AMORPHOUS) | 0.08 | 5 |
| COMPAATIVE EXAMPLE 2 | $Co_2Fe_1Ga_{0.6}Ge_{0.8}$ (CRYSTAL) | $(Co_{0.4}Fe_{0.4}B_{0.2})_{0.93}Ta_{0.07}$ (AMORPHOUS) | 0.08 | 7 |
| EXAMPLE 1 | $Co_2Fe_1Ga_{0.5}Ge_{0.5}$ (CRYSTAL) | $(Co_{0.4}Fe_{0.4}B_{0.2})_{0.9}Ta_{0.1}$ (CRYSTAL) | 0.08 | 11 |
| EXAMPLE 2 | $Co_2Fe_1Ga_{0.6}Ge_{0.8}$ (CRYSTAL) | $(Co_{0.4}Fe_{0.4}B_{0.2})_{0.9}Ta_{0.1}$ (CRYSTAL) | 0.09 | 14 |
| EXAMPLE 3 | $Co_2Fe_1Ga_{0.5}Ge_{0.5}$ (CRYSTAL) | $(Co_{0.2}Fe_{0.6}B_{0.2})_{0.9}Ta_{0.1}$ (CRYSTAL) | 0.07 | 13 |
| EXAMPLE 4 | $Co_2Fe_1Ga_{0.6}Ge_{0.8}$ (CRYSTAL) | $(Co_{0.2}Fe_{0.6}B_{0.2})_{0.9}Ta_{0.1}$ (CRYSTAL) | 0.08 | 16 |
| EXAMPLE 5 | $Co_2Fe_1Ga_{0.6}Ge_{0.8}$ (CRYSTAL) | $(Co_{0.2}Fe_{0.65}B_{0.15})_{0.85}Ta_{0.15}$ (CRYSTAL) | 0.11 | 18 |
| EXAMPLE 6 | $Co_2Fe_1Ga_{0.6}Ge_{0.8}$ (CRYSTAL) | $(Co_{0.39}Fe_{0.19}Ga_{0.12}Ge_{0.15}B_{0.15})_{0.85}Ta_{0.15}$ (CRYSTAL) | 0.13 | 21 |

The MR ratio of the magnetoresistance effect element 10 according to Example 5 was 18% and RA was 0.11 $\Omega \cdot \mu m^2$.

Example 6

Example 6 is different from Example 1 in that the composition of the first layers 1A and 2A is $Co_2FeGa_{0.6}Ge_{0.8}$ and the composition of the second layers 1B and 2B is $(Co_{0.39}Fe_{0.19}Ga_{0.12}Ge_{0.15}B_{0.15})_{0.85}Ta_{0.15}$. In the Co-based Heusler alloy constituting the first layers 1A and 2A and $(Co_{0.39}Fe_{0.19}Ga_{0.12}Ge_{0.15}B_{0.15})_{0.85}Ta_{0.15}$ of the second layers 1B and 2B according to Example 6, the Co compositional proportion is smaller than that of the stoichiometric composition.

The MR ratio of the magnetoresistance effect element 10 according to Example 6 was 21% and RA was 0.13 $\Omega \cdot \mu m^2$.

Comparative Example 1

Comparative Example 1 is different from Example 1 in that the composition of the second layers 1B and 2B is $(Co_{0.4}Fe_{0.4}B_{0.2})_{0.93}Ta_{0.07}$. Since the content of Ta in the second layers 1B and 2B was small, the mixing of atoms in the second layers 1B and 2B was not sufficient and the second layers 1B and 2B remained amorphous. Further, the first layers 1A and 2A of Comparative Example 1 were crystallized, but the crystallinity was lower than that of Example 1.

The MR ratio of the magnetoresistance effect element 10 according to Comparative Example 1 was 5% and RA was 0.08 $\Omega \cdot \mu m^2$.

Comparative Example 2

Comparative Example 2 is different from Example 2 in that the composition of the second layers 1B and 2B is $(Co_{0.4}Fe_{0.4}B_{0.2})_{0.93}Ta_{0.07}$. Since the content of Ta in the second layers 1B and 2B was small, the mixing of atoms in the second layers 1B and 2B was not sufficient and the second layers 1B and 2B remained amorphous. Further, the first layers 1A and 2A of Comparative Example 1 were crystallized, but the crystallinity was lower than that of Example 2.

EXPLANATION OF REFERENCES

1 First ferromagnetic layer
1A, 2A, 11A, 12A First layer
1B, 2B, 11B, 12B Second layer
2 Second ferromagnetic layer
3, 13 Non-magnetic layer
4, 5 Boron absorbing layer
6, 7 Buffer layer
8 Spin-orbit torque wiring
10, 10A, 10B, 10C Magnetoresistance effect element
21 Resistance measuring instrument
22 Power supply
23 Measurement unit
24 First magnetization fixed layer
25 Second magnetization fixed layer
26 DC power supply
27 Inductor
28 Capacitor
29 Output port
30, 31 Wiring
100, 101, 102 Magnetic recording element
103 Magnetic domain wall movement element
104 High frequency device
DW Magnetic domain wall
MD1 First magnetic domain
MD2 Second magnetic domain
Sub Substrate

What is claimed is:
1. A magnetoresistance effect element comprising:
a first ferromagnetic layer;
a second ferromagnetic layer; and
a non-magnetic layer provided between the first ferromagnetic layer and the second ferromagnetic layer,
wherein at least one of the first ferromagnetic layer and the second ferromagnetic layer includes a first layer and a second layer in order from the side closer to the non-magnetic layer,
wherein the first layer contains a crystallized Co Heusler alloy, wherein at least a part of the second layer is crystallized and the second layer contains a ferromagnetic element, elemental boron, and an additive element, and wherein the additive element is any element selected from a group consisting of Ti, V, Cr, Cu, Zn, Zr, Mo, Ru, Pd, Ta, W, Ir, Pt, and Au.

2. The magnetoresistance effect element according to claim 1, wherein both the first ferromagnetic layer and the second ferromagnetic layer include the first layer and the second layer.

3. The magnetoresistance effect element according to claim 1, wherein the Co Heusler alloy is represented by CoYZ or $Co_2YZ$ in stoichiometric composition, and wherein the Co Heusler alloy has a Co compositional proportion smaller than that of the stoichiometric composition.

4. The magnetoresistance effect element according to claim 2, wherein the Co Heusler alloy is represented by CoYZ or $Co_2YZ$ in stoichiometric composition, and wherein the Co Heusler alloy has a Co compositional proportion smaller than that of the stoichiometric composition.

5. The magnetoresistance effect element according to claim 1, wherein the second layer is made of crystallized CoFeB-A, and wherein the content of Fe is larger than the content of Co in the second layer.

6. The magnetoresistance effect element according to claim 1, wherein the content of the additive element is larger than the content of boron in the second layer.

7. The magnetoresistance effect element according to claim 1, wherein the first layer and the second layer are lattice-matched.

8. The magnetoresistance effect element according to claim 1, further comprising:

a boron absorbing layer in contact with a surface of the second layer on a side far from the non-magnetic layer, wherein the boron absorbing layer contains any element selected from a group consisting of Ti, V, Cr, Cu, Zn, Zr, Mo, Ru, Pd, Ta, W, Ir, Pt, and Au.

9. The magnetoresistance effect element according to claim 1, wherein the Co Heusler alloy is an $L2_1$ structure or a B2 structure.

10. The magnetoresistance effect element according to claim 1, wherein the Co Heusler alloy is represented by $Co_2Y_\alpha Z_\beta$, wherein Y is one or more elements selected from a group consisting of Fe, Mn, and Cr, and wherein Z is one or more elements selected from a group consisting of Si, Al, Ga, and Ge and $\alpha+\beta>2$ is satisfied.

11. The magnetoresistance effect element according to claim 1, further comprising:

a buffer layer provided at least one between the first ferromagnetic layer and the non-magnetic layer and between the second ferromagnetic layer and the non-magnetic layer, and the buffer layer includes a NiAl alloy or Ni.

12. The magnetoresistance effect element according to claim 11, wherein the thickness of the buffer layer is 0.63 nm or less.

13. The magnetoresistance effect element according to claim 1, wherein the non-magnetic layer is a metal or alloy containing any element selected from a group consisting of Cu, Au, Ag, Al, and Cr.

14. The magnetoresistance effect element according to claim 1, further comprising:

a substrate, wherein the substrate is a base on which the first ferromagnetic layer, the second ferromagnetic layer, and the non-magnetic layer are laminated, and wherein the substrate is amorphous.

* * * * *